United States Patent [19]

Fairchild et al.

[11] Patent Number: 5,153,592
[45] Date of Patent: Oct. 6, 1992

[54] 16 BIT ERROR-CORRECTING DIGITAL-TO-ANALOG CONVERTER

[75] Inventors: Jack T. Fairchild, Garland; George W. Dietrich, Plano, both of Tex.

[73] Assignee: Texas Instruments Incorporated, Dallas, Tex.

[21] Appl. No.: 693,758

[22] Filed: Apr. 30, 1991

[51] Int. Cl.$^5$ .......................... H03M 1 06; H03M 1/68
[52] U.S. Cl. .................................... 341/118; 341/121; 341/145
[58] Field of Search ............... 341/118, 119, 120, 121, 341/144, 145, 131

[56] References Cited

U.S. PATENT DOCUMENTS

| | | | |
|---|---|---|---|
| 4,222,107 | 9/1980 | Mrozowski et al. | 341/120 |
| 4,272,760 | 6/1981 | Prazak et al. | 341/120 |
| 4,316,178 | 2/1982 | Shibayama et al. | 341/118 |
| 4,340,882 | 7/1982 | Maio et al. | 341/118 |
| 4,369,432 | 1/1983 | Mikami | 341/120 |
| 4,381,495 | 4/1983 | Hotta et al. | 341/120 |
| 4,523,182 | 6/1985 | Harvey et al. | 341/118 |
| 4,811,017 | 3/1989 | Gulczynski | 341/145 |
| 4,835,535 | 5/1989 | Shibayama et al. | 341/120 |
| 4,947,172 | 8/1990 | Suzuki | 341/145 |
| 4,967,197 | 10/1990 | Peng | 341/118 |

FOREIGN PATENT DOCUMENTS

63-121320  5/1988  Japan .................................. 341/118

OTHER PUBLICATIONS

Kuung, Chong Min and Kim Choongki, "Charge-Coupled Analog-To-Digital Converter," *IEEE Journal of Solid-State Circuits*, vol. SC-16, No. 6, Dec., 1981.

Naylor, Jimmy R., "A Complete High-Speed Voltage Output 16-Bit Monolithic Dac," *IEEE Journal of Solid-State Circuits*, vol. SC-18, No. 6, Dec., 1983.

Yamada, Yasuhiro, et al., "A 16-Bit CMOS D/A Converter for Digital Audio Applications," *IEEE Transactions on Consumer Electronics*, vol. CE-33, No. 3, Aug., 1987.

Schouwenaars, Hans J. et al., "A Monolithic Dual 16-Bit D/A Converter," *IEEE Journal of Solid-State Circuits*, vol. SC-21, No. 3, Jun., 1986.

Maio, Kenji et al., "An Untrimmed D/A Converter with 14-Bit Resolution" *IEEE Journal of Solid-State Circuits*, vol. SC-21, No. 6, Dec., 1981.

*Primary Examiner*—Howard L. Williams
*Attorney, Agent, or Firm*—B. Peter Barndt; Richard L. Donaldson

[57] ABSTRACT

An improved digital-to-analog conversion circuit (10) comprises digital circuitry (12) for receiving digital input signals from a digital input signal source, conversion circuitry (42) receiving the digital input signals and producing analog output signals and analog output circuitry (44) for sending analog output signals to an analog output signal load. The conversion circuit (10) includes calibration circuitry (46) that samples analog output signals from analog output circuitry (44) and includes a reference signal source (52) for producing a plurality of reference signals. A comparator (50) compares a predetermined aspect of the analog output signals to the reference signals to produce therefrom a plurality of difference signals. Correction circuitry includes error detection circuit (95) that includes a successive approximation register (62) and a digital controller (66) for receiving the difference signals and a digital interpolator (26) for generating a plurality of correction signals. The digital interpolator (26) receives the correction signals in response thereto and sends signals to a vernier digital-to-analog converter (38) to precisely control the analog output signals from conversion circuitry (42).

20 Claims, 3 Drawing Sheets

16 BIT ERROR-CORRECTING DIGITAL-TO-ANALOG CONVERTER

TECHNICAL FIELD OF THE INVENTION

The present invention relates to electronic circuitry and more particularly to a 16-bit error-correcting digital-to-analog converter (DAC) for generating precise analog output signals in response to digital input signals.

BACKGROUND OF THE INVENTION

In high-performance digital audio equipment such as compact disk players and digital tape or cassette recorders, the total dynamic behavior of the digital-to-analog conversion system plays an important role. This imposes strong demands on the digital-to-analog converter (DAC) design, such as oversampling capabilities and stereo-signal handling. To realize low power consumption in DAC design, CMOS technology is suitable. However, traditional CMOS DACs are expensive to fabricate.

K. Maio, et al., *An Untrimmed D/A Converter with 14-Bit Resolution*, IEEE J. Solid-States Circuits, Vol. SC-16, No. 6, December 1981 discloses a 14-bit DAC with more than 16-bit linearity that is useable in high fidelity digital audio systems and precision measuring equipment. That paper describes a monolithic DAC which uses a new compensation technique for the DAC linearity, called the "self-compensation technique". The DAC of the Maio paper compensates for linearity error by a calibration technique which references to a ramp function with about 17-bit linearity, thus avoiding the trimming of analog components. Although the DAC of the Maio article provides a linearity error of less ±½ LSB and settling time of 1-2 μsec, it yet suffers from two significant limitations. First of all, use of the calibration ramp function requires a very low dielectric absorption integrating capacitor that causes monotonicity problems at the MSB transition points. Secondly, the Maio DAC uses 5 LSBs and 3 sub-LSBs to correct only the 5 MSB error.

Thus, there is a need for a simple, low-cost, low-power consumption digital-to-analog converter to provide sufficient accuracy for 16-bit digital-to-analog conversion.

There is a need for a 16-bit digital-to-analog converter that provides minimal circuit die size for very linear output characteristics, including absolute gain.

Moreover, there is a need for 16-bit digital-to-analog converter that provides total dynamic performance, accuracy, and reliability in the 16-bit regime.

Additionally, there is the need for a 16-bit digital-to-analog converter that provides good monotonicity at the most significant bit transition points while at the same time providing ½ least significant bit differential linearity over the entire output range.

SUMMARY OF THE INVENTION

The present invention accordingly provides a 16-bit error correcting digital-to-analog converter (DAC) which overcomes the problems and satisfies the needs previously considered.

According to one aspect of the invention, there is provided an improved digital-to-analog conversion circuit for receiving a plurality of digital input signals from a digital signal source and controllably producing a plurality of analog output signals and sending the analog output signals to an analog signal load. The digital-to-analog conversion circuit comprises digital circuitry for receiving the digital input signals from the digital input source. Conversion circuitry associates with the digital circuitry for producing the analog output signals in response to the digital input signals. Analog output circuitry associates with the conversion circuitry to send analog output signals to the analog output signal load. The improved digital-to-analog conversion circuit includes reference circuitry associated with analog output circuitry for sampling the analog output signals. The reference circuitry comprises a reference signal source for producing a plurality of reference signals and a comparator compares a predetermined aspect of the analog output signals to the reference signals. The reference circuit produces, in response to the comparison, a plurality of difference signals. The correction circuitry associates with the reference circuitry for receiving the difference signals and generating a plurality of correction signals.

In the digital-to-analog conversion circuit, conversion circuitry further comprises a vernier correction circuit associated to receive the correction signals from the correction circuitry and produce from the correction signals a plurality of control signals to precisely control the analog output signals.

In the preferred embodiment, the conversion circuitry includes a 6-bit upper DAC, a 10-bit lower DAC, and an 8-bit vernier DAC. Instead of using a ramp generator, error detection and correction is done by comparing the DAC output against a highly accurate voltage divider having a total of 128 equal voltage levels interval taps. The voltage divider is accurate to ±0.0002% A 7-bit binary signal from a digital controller within the correction circuitry is applied to a decoder and multiplexer to select the desired calibration voltage or reference signal. Error handling surge is accomplished by using a comparator, a successive approximation register, a digital controller, a 128×8 random access memory, an 8-bit vernier DAC, a digital interpolator, and various select switches which are operated by a mode control line. Two modes of operation for the improved digital-to-analog conversion circuit of the present invention are normal digital-to-analog conversion (NDAC) and calibrate digital-to-analog conversion (CDAC).

A technical advantage of present invention is that the correction circuitry in association with the conversion circuitry provides for continuous self-correction of analog output signals.

Yet another technical advantage of the present invention is that it minimizes the effects of thermal gradients, signal instability, and circuit setting time.

The simplicity of the circuit provides for minimal bit size in circuit fabrication as well as low cost and low power consumption. As a result, yet another technical advantage of the present invention is that it provides an improvement in total dynamic performance of 16-bit digital-to-analog conversion.

BRIEF DESCRIPTION OF THE DRAWINGS

The invention and its modes of use and advantages are best understood by reference to the following description of illustrative embodiments when read in conjunction with the accompanying drawings, wherein.

DETAILED DESCRIPTION OF THE INVENTION

The preferred embodiment of the present invention is best understood by referring to the figures wherein like number are used for like and corresponding parts of the various components.

Figure 1:
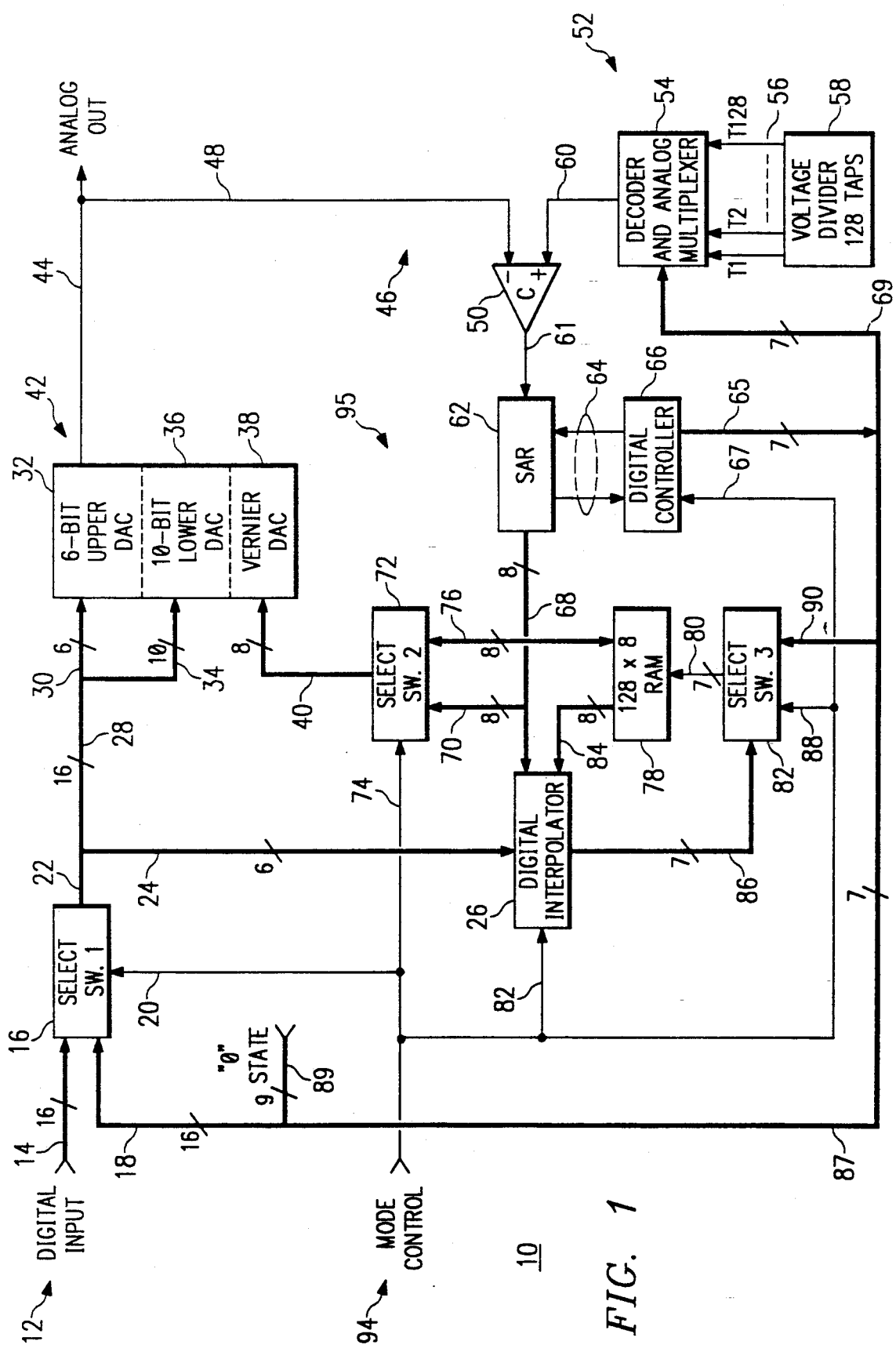
FIG. 1 provides a schematic block diagram of the 16-bit error-correcting digital-to-analog converter of the present invention.

FIG. 1 illustrates a schematic block diagram of the 16 bit error-correcting digital-to-analog (DAC) conversion circuit 10 of the present invention. At the upper left hand corner of the diagram, digital input 12 goes to 16-bit lines 14 of select switch 1 16. Select switch 1 16 receives 16-bit input from line 18 and single-bit input from line 20, and provides 16-bit output at line 22. From line 22, 6-bit lines 24 go to digital interpolator 26 and 16-bit lines 28 are split to 6-bit lines 30 which feed 6-bit upper DAC 32. The 10-bit lines 34 go to 10-bit lower DAC 36. Vernier DAC 38 controls the operation of 6-bit upper DAC 32 and 10-bit lower DAC 36 in response to 8-bit input 40. Six-bit upper DAC 32, 10-bit lower DAC 36, and vernier DAC 38 comprise one embodiment of the conversion circuitry 42 of the present invention. From conversion circuitry 42, analog output circuit 44, provides analog output signals. Tapping from analog output circuitry 44, reference circuitry 46 samples analog output via line 48 and directs this input to comparator 50. Reference circuitry 46 also includes reference signal source 52. Reference signal source 52 comprises decoder and analog multiplexer 54 which receives 128 voltage divider tap input 56 from voltage divider 58. From reference signal source 52, line 60 provides an input to comparator 50.

Comparator 50 provides a difference signal 61 to error detection circuit 95 which contains successive approximation register (SAR) 62. The SAR 62 communicates via circuit 64 with digital controller 66 and generates 8-bit output 68 to digital interpolator 26. Additionally, SAR 62 provides 8-bit input 70 to select switch 2 72. Select switch 2 72 also receives single-bit mode control input 74 and communicates via 8-bit communication path 76 with 128×8 RAM 78. Select switch 2 72 output is the -8-bit input 40 to vernier DAC 38.

The 128×8 RAM 78 not only communicates with select switch 2 72, but also receives 7-bit input 80 from select switch 3 82 and provides 8-bit output 84 to digital controller 66. Select switch 3 82 receives 7-bit input 86, single-bit mode control input 88 and 7-bit output 90 from digital controller 66. Digital interpolator 26 takes 6-bit output 24 from select switch 1 16, single-bit mode control signal 92 from mode control 94 and 8-bit input 84 from RAM 78.

Digital controller 66 also receives mode control signal 67 from mode control input 94. Controller 66 further provides 7-bit digital output 65 to decoder and analog multiplexer 54 via 7-bit input 69, 7-bit input 86 to select switch 3 82 and 7-bit input 87 to be combined with 9-bit "0" state input 89 for 16-bit input 18 to select switch 1 16.

The main digital-to-analog conversion circuit 42 comprises 6-bit upper DAC 32, 10-bit lower DAC 36, and 8-bit vernier DAC 38. Instead of using a ramp generator, the digital-to-analog conversion circuit 10 has error detection circuit 95 to respond to comparator 50 difference signal. Voltage divider 58 provides a highly accurate output (having a accuracy of ±0.0002%) tapped at 128 equal intervals of voltage levels. The 7-bit signal 69 from digital controller 66 is applied to decoder and multiplexer 54 to select the desired calibration voltage. Error handling and storage for detection circuit 95 is accomplished by using comparator 50, SAR 62, digital controller 66, 128×8 RAM 78, 8-bit vernier DAC 38, digital interpolator 26, and select switch 1 16, select switch 2 72, and select switch 3 82. Select switches 1 16, select switch 2 72 and select switch 3 82 are controlled by mode control line 92. The two modes of operation are normal DAC (NDAC) and calibrate DAC (CDAC).

In the CDAC mode, upon the detection of a different signal comparator 50, error detection circuit 95 will generate a correction signal to compensate for the difference between the signals from analog output circuit 44 and reference signal source 52. The first step in the detection and compensation sequence occurs when digital controller 66 receives through SAR 62 a difference signal from comparator 50 and outputs to digital interpolator 26 an 8-bit parallel signal 68 representing the eight most significant bits from conversion circuitry 42. This 8-bit signal is fed through select switch 1 16 to conversion circuitry 42. This causes the eight least significant bits to equal zero and the 8-bit parallel signal to be directed through select switch 3 82 to 128×8 RAM 78 for its address signal. The 7-bit signal from line 65 is also fed directly to decoder and analog multiplexer 54 via line 69 with the first 128 voltage levels being selected for application to comparator 50. In the preferred embodiment, the 16-bit conversion circuit 10 can hold 20-bit differential and integral linearity over only a ten least significant bit segment. There are sixty-four of these segments.

Calibration is performed at two points within each segment. One fourth of the way up the segment and three fourths up the segment calibration occurs. Therefore, the first and second calibration points for the first or lowest segment are at $$0000000100000000 \text{ (0100-hex)} \tag{1}$$

and $$0000001100000000 \text{ (0300-hex)} \tag{2}$$

The other input to comparator 50 is fed by analog output circuit 44 from conversion circuitry 42. Consequently, SAR 62 is directed by comparator 50 to develop an error correction signal which is applied through select switch 2 72 to the 8-bit vernier DAC 38.

Figure 2:
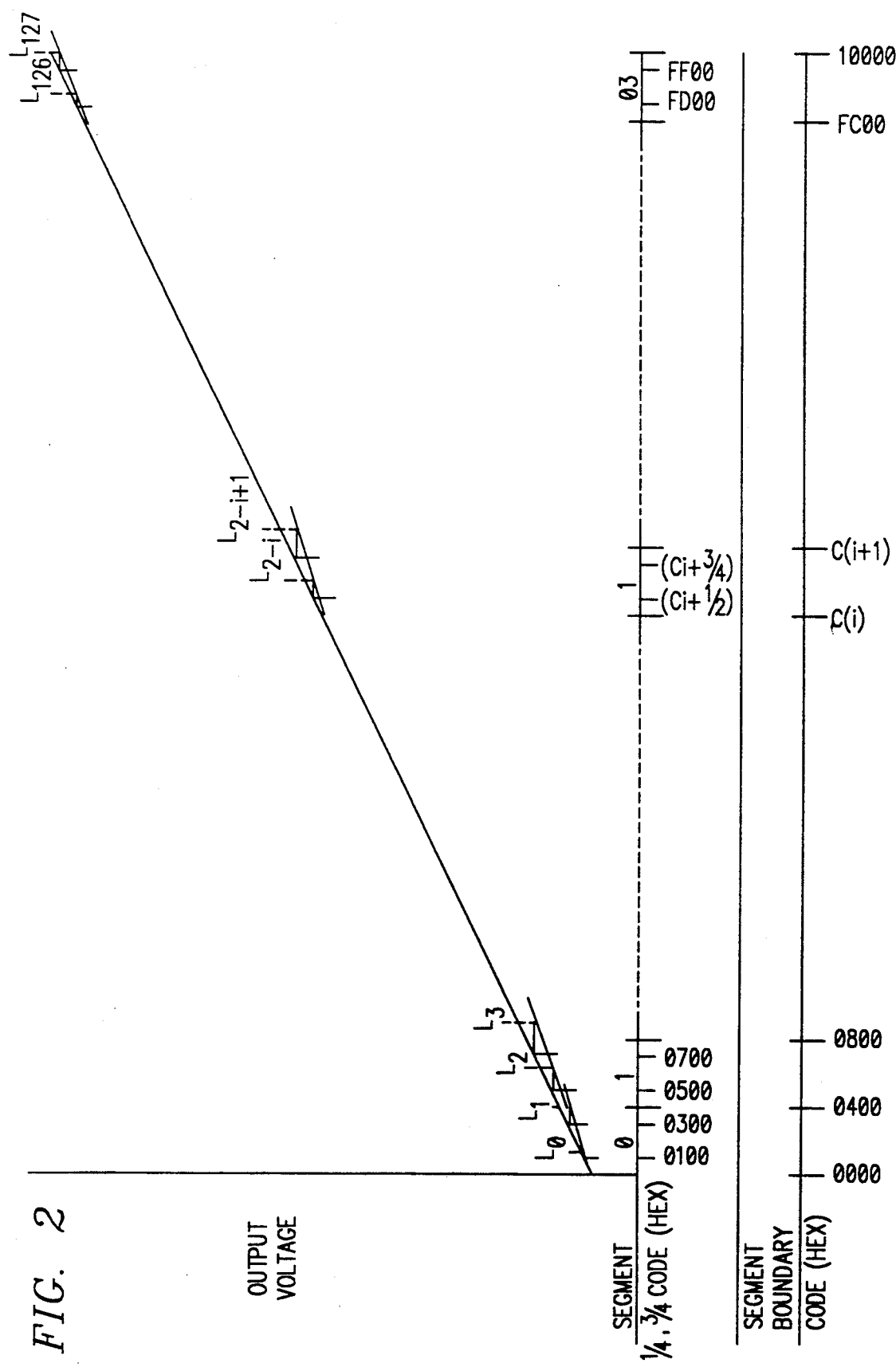
FIG. 2 provides a graph illustrating the operation for one embodiment of the vernier digital-to-analog circuit of the present invention.

FIG. 2 is an exploded view of the 64 segments from conversion circuitry 42. Along the vertical axis appears output voltage levels from the 128 taps of voltage divider 58. The horizontal axes show the particular SEGMENTs associated with each of the voltage taps, as well as CODE in hexadecimal, and INPUT signal level from digital controller 66. FIG. 2 illustrates the error correction signal generation at reference signal source 52. Gain from the 10-bit lower DAC 36 is set slightly below the overall gain of conversion circuitry 42. This ensures that conversion circuitry 42 is monotonic without correction, but only adequate corrections are necessary. This further ensures that adequate corrections are applied only through vernier DAC 38. When SAR 62 conversion time is complete, the "error correction signal" is retained as the first word. At the end of SAR 62 conversion time, digital controller 66 sends a 7-bit code for the second voltage level to be applied to comparator 50. When this occurs, the above sequence repeats and the "error correction" is retained as the second word.

Using these two error coefficients, the digital interpolator 26 determines the slope and offset coefficients for this segment of the correction factors to be used during the NDAC mode of operation. For this purpose, the slope and intercept words are stored in the 128×8 RAM 78. Similarly, all of the 64 segments are checked for digital-to-analog conversion accuracy and the error correction slope and intercept coefficients for each segment is stored in 128×8 RAM 78.

In the NDAC mode, the information addressed by the digital input is used to compensate for conversion circuitry 42 non-linearity through the use of vernier DAC 38. Vernier DAC 38 accepts an 8-bit signal via line 40 from select switch 2 72. This occurs because two additional bits of error correction are added to compensate for errors with one quarter least-significant-bit-resolution. In this approach, the 8-bit error signal is summed with the six least significant bits of the 16-bit digital input with two-bits remaining for one-half and one-quarter least significant bit resolution as compared to the 16-bit signal.

The slope of the correction factor for the i-th segment shown in FIG. 2 is $$M_i = (2^7/2^{16}) \cdot [L_{(2i+1)} - L_{2i}] \tag{3}$$

The offset correction factor is:

$$OS_i = L_{2i} \cdot (i + \tfrac{3}{4}) - [L_{2i+1}] \cdot (i + \tfrac{1}{4}) \tag{4}$$

The corrected input code, $C_{IN}(i,X)$, for the input code X is first determined to be the i-th segment by:

$$i = X/64 \text{ (truncated)} \tag{5}$$

equals $$C_{IN}(i,X) = M_i \cdot X + OS_i \tag{6}$$

and the correction code $C_{OR}(i,X)$ to vernier DAC 38 is $$C_{OR}(i,X) = C_{IN}(i,X) - X. \tag{7}$$

When the NDAC mode is re-established after conversion circuitry 42 calibration, normal operation begins this by mode control input 94 placing select switch 1 16, select switch 2 72, and select switch 3 82 in the NDAC position. At that point, in the 16-bit digital input 12 is applied to conversion circuit 42 through select switch 1 16. Simultaneously, the 8-bit "error-correction signal" on line 40 from select switch 2 72 is applied to vernier DAC 38. This signal originates at digital interpolator 26. The "error-correction signal" is forced into synchronization with the incoming digital code, because the six most significant bits of the incoming digital code are used to address the 128×8 RAM 78 via the digital interpolator 26 and select switch 3 82.

The compensation interval in this operation depends upon the accuracy desired and the temperature coefficient of the 16-bit conversion circuit 10. The calibration operation may be performed as required with new compensation data being written into 128×8 RAM 78. Therefore, very good precision can always be maintained at the discretion of the system.

Conversion circuitry 42 is designed to have 16-bit resolution, but has only about 10-bit untrimmed linearity because of the front end process variations. Thus, most of the linearity errors occur mainly in the six most significant bits and are within sixty-four least significant bits bounds. To compensate for errors with $\tfrac{1}{4}$ least significant bit resolution, an 8-bit error addition from 128×8 RAM 78 is necessary. For $\tfrac{1}{8}$ least significant bit 16-bit resolution, a 512-bit RAM would probably work satisfactorily.

Figure 3:
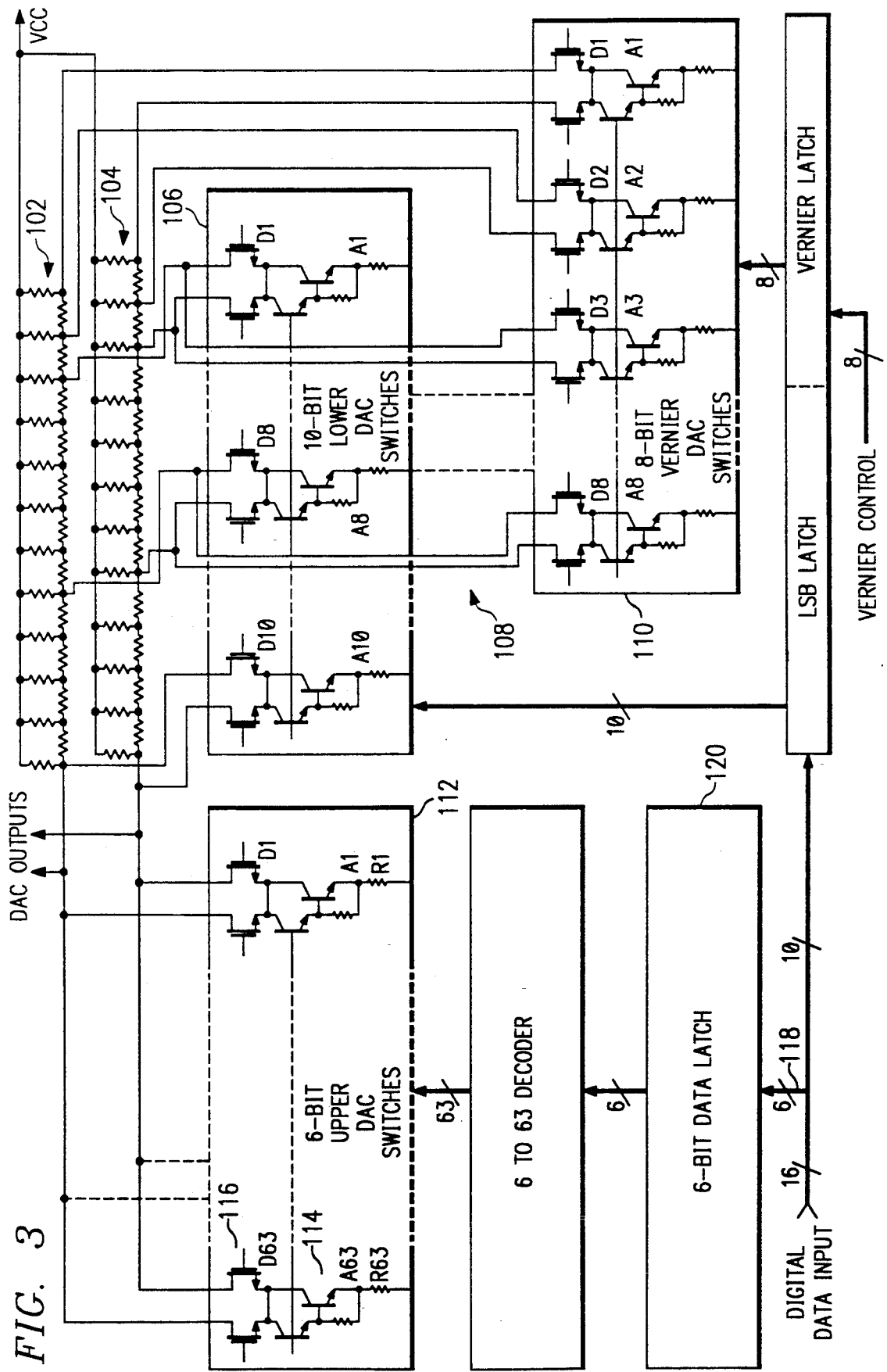
FIG. 3 provides a detailed partial schematic diagram for one embodiment of the 16-bit digital-to-analog conversion circuit of the present invention.

A detailed schematic of the conversion circuitry 42 associated with vernier DAC 38 appears at FIG. 3. Accordingly, conversion circuitry 42 consists of 12-stage R×2R ladder network 102. Ladder network 102 has a mirror image 104 for the switch's complement side for thermal and IR symmetry. Ladder network 102 is driven by 10 equally-weighted current switches 106 into the upper 10 resistor stages, 8 equally-weighted Currents 108 summing into the lower 8 stages of the 12-stage resistor network 102 from the 8-bit vernier DAC switches 110, and 63 equally-weighted current switches summing into the resistor network output mode at 6-bit upper DAC switches 112. All of the current switches operate at an identical current level.

For the 6-bit upper DAC switches 112, the 10-bit lower DAC switches 106, and the 8-vernier DAC switches 110 the switch is a bipolar-CMOS differential current pair. The precision-match current is generated by a Darlington transistor such as transistor A63 114 at 6-bit upper DAC switches 112 coupled with a Cermet emitter degeneration resistor, for example R63 114, for match control. Current is switched by a differential configured CMOS transistor pair D63 116 which has no control-gate current loss.

With 8-bit vernier DAC switches 110 supplying current into the corresponding resistor network bit nodes at 102, the non-uniformities due to the second DAC resistor network are eliminated. The 63 most significant bit current sources into 6-bit upper DAC switches 112 assure most significant bit monotanicity and these sources are driven by the 6-bit binary input to 6-bit data latch 120.

Reference signal source 52 includes a diode compensated Zener voltage reference which provides a precise 4.5 volt supply that is virtually independent of changes in power supply voltage, ambient temperature, and output loading. Provision is provided to trim out the initial offset error.

Comparator 50 must be capable of operating over a dynamic range of at least 120 dB for a 20-bit DAC operation. Assuming the 16-bit DAC has an analog output maximum voltage level of 4.5 volts, the quantization resolution level is about +17.2 microvolts. For the DC to 16-kHz bandwidth, the gain needs to be flat to ±0.000033 dB to hold the effective 18-bit absolute accuracy of the entire band. This becomes a severe thermal problem at frequencies below 20 Hz. For Nyquist sampling of a 16-kHz signal, the amplifier has to have better than 3 MHz, −3 dB bandwidth in all gain modes; i.e. 22-MHz gain bandwidth product, in the worst case.

Reference circuit 46 also includes 5-volt limiters. To keep the semiconductor stages out of saturation during periods of input overdrive. This requirement is to be met by the use of buried Zener diodes with threshold adjustment to give 5.5-volt clamp level.

The CMOS transmission circuits, which will be used in the analog signal paths, are back-to-back PMOS and NMOS devices with "ON" resistances of less than 180

Ω over the temperature range. These switches, properly designed, are self deglitching, yet provide a good, low "ON" resistance. For the switch not to contaminate the signal to the 18-bit resolution, with an R-on of 180, the gain setting feedback resistor must be less than 94 MΩ. That resistance is impractical, therefore, absolute gain accuracy in the three modes must be compromised.

Although the present invention and its advantages have been described in detail, it should be understood that various changes, substitutions and alterations can be made herein without departing from the spirit and scope of the invention as defined in the appended claims.

What is claimed is:

1. An improved digital-to-analog conversion circuit for receiving a plurality of digital input signals from a digital signal source and controllably producing a plurality of analog output signals and sending the analog output signals to an analog signal load, said circuit comprising:

digital circuitry for receiving the digital input signals from the digital input signal source;

conversion circuitry in association with said digital circuitry for producing the analog output signals in response to the digital input signals;

analog output circuitry in association with said conversion circuitry for sending the analog output signals to the analog output signal load;

reference circuitry associated with said analog output circuitry for sampling the analog output signals, said reference circuitry comprising a reference signal source for producing a plurality of reference signals and a comparator, said comparator associated to compare one of the analog output signals to one of said reference signals to produce at least one difference signal;

correction circuitry associated with said reference circuitry for receiving said difference signal and generating a plurality of correction signals, said correction signals including a slope correction factor:

$$M_i = (2^7/2^{16}) \cdot [L_{(2i+1)} - L_{2i}],$$

said correction signals further including an offset correction factor:

$$OS_i = L_{2i} \cdot (i + \tfrac{3}{2})] - [L_{2i+1}) \cdot (i + \tfrac{1}{2}],$$

where i represents an ith segment, L, of a predetermined correction range; and said conversion circuitry further comprising a vernier conversion circuit associated to receive from said correction circuitry said correction signals and produce therefrom a plurality of control signals to precisely control the analog output signals from said conversion circuitry.

2. The conversion circuit of claim 1, wherein said reference circuitry comprises a voltage divider for producing a precise reference voltage; and a decoder and analog multiplexer associated to receive said reference voltage from said voltage divider, said decoder and analog multiplexer associated with said comparator to permit said comparator to compare the analog output signals to said reference signals.

3. The circuit of claim 1, wherein said correction circuitry comprises a sequential approximation register for receiving said difference signals from said comparator; and a digital interpolator for providing a correction signal to said vernier conversion circuit.

4. The circuit of claim 1, wherein said conversion circuitry comprises a 6-bit upper digital-to-analog converter and a 10-bit lower digital-to-analog converter and wherein said vernier conversion circuit associates with said 6-bit converter and said 10-bit converter to precisely control analog output signals from said conversion circuitry.

5. The circuit of claim 1, wherein said comparator comprises an operational amplifier, said operational amplifier associated to receive the analog output signals and said reference signals and to compare the analog output signals to said reference signals to produce said difference signals and direct signals to said correction circuitry.

6. The circuit of claim 5, wherein said operational amplifier continually receives the analog output signals.

7. The circuit of claim 3, further comprising a remote control circuit for selectively controlling the remote of operation of said conversion circuit, said mode control circuit comprising a plurality of select switches associated with said vernier DAC, said digital circuitry, and said digital interpolator for selecting between a normal digital to analog conversion mode and a calibrate digital to analog conversion mode.

8. The circuit of claim 3, further comprising a random access memory for storing a plurality of control signals for controlling said digital interpolator and said vernier conversion circuit to precisely control the analog output signals.

9. A method for convention digital input signals from a digital signal source and controllably producing a plurality of analog output signals and sending the analog output signals to an analog signal load, said method comprising the steps of:

receiving the digital input signals from the digital input signal source;

receiving the digital input signals from digital circuitry and producing the analog output signals in response to the digital input signals;

sending the analog output signals to the analog output signal load;

sampling the analog output signals and producing a plurality of reference signals;

comparing at least one of the analog output signals to a selected one of said reference signals and producing at least one difference signal therefrom;

receiving said difference signal in a correction circuit and generating a plurality of correction signals in response to said difference signals, said correction signals including a slope correction factor:

$$M_i = (2^7/2^{16}) \cdot [L_{(2i+1)} - L_{2i}],$$

said correction signals further including an offset correction factor:

$$OS_i = L_{2i} \cdot (i + \tfrac{3}{2})] - [L_{2i+1}) \cdot (i + \tfrac{1}{2}],$$

where i represents an ith segment, L, of a predetermined correction range; and receiving said correction signals from said correction circuitry and producing therefrom a plurality of control signals to precisely control the analog output signals.

10. The method of claim 9, wherein said reference signal producing step further comprises the steps of producing a plurality of precisely divided voltage levels in response to said digital input signals, selecting one of said precisely divided voltage levels and generating said reference signals.

11. The method of claim 9, further comprising the step of receiving said difference signal in a serial adjustment register and sending said signals to a digital interpolator circuit and generating from said digital interpolator circuit a plurality of correction signals and directing said correction signals to a vernier conversion circuit.

12. An improved 16-bit digital to analog converter comprising:
   circuitry for receiving digital input;
   circuitry for converting said digital input to analog output;
   circuitry for sampling the analog output and comparing said analog output to a predetermined reference signal, said reference signal comprising a desired analog output; and
   circuitry associated with said comparing circuitry for producing a correction signal, said correction signal including a slope correction factor:

$$M_i = (2^7/2^{16}) \cdot [L_{(2i+1)} - L_{2i}].$$

said correction signal further including an offset correction factor:

$$OS_i = L_{2i} \cdot (i + \tfrac{3}{2})] - [L_{2i+1}) \cdot (i + \tfrac{1}{2}().$$

where i represents an ith segment, L, of a predetermined correction range, said circuitry further associated with said converting circuitry for directing said correction signal to said converting circuitry to correct said analog output to said desired analog output signal.

13. The apparatus of claim 12 wherein said correction circuitry comprises a vernier output circuit for precisely controlling the analog output from said converting circuitry.

14. The apparatus of claim 12 further comprising a voltage divider for producing a plurality of voltage signals; and
   a decoder and analog multiplexer associated to receive said plurality of voltage signals from said voltage divider for producing said desired analog output voltage signal.

15. The apparatus of claim 12, wherein said correction circuitry further comprises a sequential approximation register responsive to said difference signal; and
   a digital interpolator circuit for providing a correction signal to said Vernier output circuit.

16. The apparatus of claim 13, wherein said converting circuitry comprises a 6-bit upper digital to analog converter in association with a 10-bit lower digital to analog converter and wherein said vernier output circuit associates with said 10-bit lower digital to analog converter for precisely adjusting analog output voltage from said 10-bit lower digital to analog converter, thereby providing accurate analog output from said converter circuitry.

17. The apparatus in claim 12, wherein said comparing circuitry comprises an operational amplifier, said operational amplifier being associated to receive said desired analog output voltage and said actual analog output voltage for comparing said desired analog output voltage to said actual analog output voltage to produce a reference output voltage to said correcting circuitry.

18. The apparatus of claim 12, wherein said sampling of said analog output occurs continuously.

19. The apparatus of claim 13, wherein said correction circuitry further comprises a plurality of select switches for controlling said Vernier output circuit.

20. The apparatus of claim 12, wherein said correction circuitry further comprises a random access memory for storing said reference signals.

* * * * *